(12) United States Patent
Lu et al.

(10) Patent No.: US 12,234,541 B2
(45) Date of Patent: Feb. 25, 2025

(54) POLYMER COMPOSITE MATERIAL AND PREPARATION METHOD THEREOF

(71) Applicant: CITY UNIVERSITY OF HONG KONG SHENZHEN FUTIAN RESEARCH INSTITUTE, Shenzhen (CN)

(72) Inventors: Jian Lu, Shenzhen (CN); Yu Bu, Shenzhen (CN)

(73) Assignee: CITY UNIVERSITY OF HONG KONG SHENZHEN FUTIAN RESEARCH INSTITUTE, Shenzhen (CN)

( * ) Notice: Subject to any disclaimer, the term of this patent is extended or adjusted under 35 U.S.C. 154(b) by 166 days.

(21) Appl. No.: 17/971,912

(22) Filed: Oct. 24, 2022

(65) Prior Publication Data

US 2024/0035147 A1 Feb. 1, 2024

Related U.S. Application Data

(63) Continuation of application No. PCT/CN2022/113109, filed on Aug. 17, 2022.

(30) Foreign Application Priority Data

Aug. 1, 2022 (CN) .......................... 202210925347.1

(51) Int. Cl.
*C23C 14/20* (2006.01)
*C08J 5/18* (2006.01)
(Continued)

(52) U.S. Cl.
CPC ............. *C23C 14/205* (2013.01); *C08J 5/18* (2013.01); *C23C 14/021* (2013.01);
(Continued)

(58) Field of Classification Search
CPC .................................................... C23C 14/205
(Continued)

(56) References Cited

U.S. PATENT DOCUMENTS

2009/0301610 A1 12/2009 Gillon et al.
2016/0153081 A1 6/2016 Lai et al.
(Continued)

FOREIGN PATENT DOCUMENTS

CN 102348599 A 2/2012
CN 102618829 A 8/2012
(Continued)

OTHER PUBLICATIONS

Machine_English_translation_KR_20080099418_A; Bae J., et al.; The Deposition Method of Metal Thin Film on Polymer Substrate by Magnetron Roll Sputtering; Nov. 13, 2008; EPO; whole document (Year: 2024).*

(Continued)

*Primary Examiner* — Tahseen Khan
(74) *Attorney, Agent, or Firm* — Westbridge IP LLC

(57) ABSTRACT

Disclosed are a polymer composite material and a preparation method thereof. The polymer composite material includes a polymer base layer and a metal thin film layer provided on a surface of the polymer base layer. The metal thin film layer is made of amorphous alloy. The surface of the polymer base layer is provided with a metal thin film with an amorphous structure. In this way, the arrangement of the metal thin film with amorphous structure can not only improve the mechanical properties, wear resistance and corrosion resistance of the polymer substrate material, but also can greatly improve the toughness of the polymer substrate material, to simultaneously improve the strength and toughness of the polymer material.

7 Claims, 9 Drawing Sheets

(51) Int. Cl.
  *C23C 14/02* (2006.01)
  *C23C 14/34* (2006.01)
  *C23C 14/35* (2006.01)

(52) U.S. Cl.
  CPC .......... *C23C 14/3407* (2013.01); *C23C 14/35* (2013.01); *C08J 2367/02* (2013.01); *C08J 2379/08* (2013.01)

(58) Field of Classification Search
  USPC ........................................................ 428/215
  See application file for complete search history.

(56) References Cited

U.S. PATENT DOCUMENTS

| 2018/0127867 | A1* | 5/2018 | Lu | .................. | C23C 14/5886 |
| 2020/0340125 | A1* | 10/2020 | Lu | .................. | C23C 28/343 |

FOREIGN PATENT DOCUMENTS

| CN | 103436842 | A | | 12/2013 |
| CN | 107604330 | A | | 1/2018 |
| CN | 108411244 | A | | 8/2018 |
| CN | 111391427 | A | | 7/2020 |
| CN | 113637942 | A | | 11/2021 |
| JP | S59231719 | A | | 12/1984 |
| JP | H05339702 | A | | 12/1993 |
| JP | 2012097353 | A | | 5/2012 |
| KR | 2008099418 | A | * | 11/2008 |
| KR | 20080099418 | A | | 11/2008 |
| KR | 20210135770 | A | | 11/2021 |

OTHER PUBLICATIONS

Bu et al., Self-assembling nacre-like high-strength and extremely tough polymer composites with new toughening mechanism, Journal of Materials Science & Technology, 136, pp. 236-244, dated Aug. 18, 2022.
First Office Action issued in counterpart Chinese Patent Application No. 202210925347.1, dated Jun. 16, 2023.
Lu et al., Study and fabrication of a flexible Zr-based metallic glass thin film strain gauge, Japanese Journal of Applied Physics, 59, SIIG10, dated Apr. 6, 2020.
International Search Report and Written Opinion issued in corresponding PCT Application No. PCT/CN2022/113109, dated Dec. 20, 2022.
Chung et al., Microstructure of Mg—Zn—Ca thin film derived by pulsed laser deposition, Materials Science and Engineering B, 2011, 176, pp. 1690-1694, dated Aug. 22, 2011.
Li et al., Development of Mg-based Bulk Amorphous Alloys, Material guide, 2006, 20(2), pp. 54-57 and 65, dated Feb. 15, 2006.
Lin, The Latest Scientific and Technological Achievements Series, 2003, pp. 81-82, China Youth Press, Beijing, dated Dec. 31, 2003.
Notification to Grant Patent Right for Invention issued in counterpart Chinese Patent Application No. 202210925347.1, dated Jan. 25, 2024.
Second Office Action issued in counterpart Chinese Patent Application No. 202210925347.1, dated Oct. 16, 2023.
Zhang et al., Crystallization behavior and thermal stability of Al—Ni—Re amorphous alloys, Acta Phys. Sin., 2013, 62(13), pp. 1-8, dated Jul. 8, 2013.
Zhao et al., Microstructure and Mechanical Properties of Zr Based Bulk Amorphous Alloys and Composites, Chinese Journal of Rare Metals, 2018, 42(1), pp. 8-13, dated Jan. 19, 2018.

* cited by examiner

POLYMER COMPOSITE MATERIAL AND PREPARATION METHOD THEREOF

CROSS-REFERENCE TO RELATED APPLICATIONS

This application is a continuation application of International Application No. PCT/CN2022/113109, filed on Aug. 17, 2022, which claims priority to Chinese Patent Application No. 202210925347.1, filed on Aug. 1, 2022. The disclosures of the above-mentioned applications are incorporated herein by reference in their entireties.

TECHNICAL FIELD

The present disclosure relates to the technical field of polymer composites, in particular to a polymer composite material and a preparation method thereof.

BACKGROUND

Soft materials are becoming much more important in many fields, especially in the development of some emerging high-tech industries, such as the manufacture of aircraft tires, optical wafers and surgical implants. There is an increasing need to produce polymers that combine high strength and toughness with other special physical properties. Amorphous polymers will be deformed under external force, but their low deformability and low toughness limit large-scale applications thereof. Over the past few years, extensive efforts have been made to strengthen and toughen polymers, and many significant advances have been made. Generally, traditional modification methods can be divided into two categories, mainly including (1) regulation of molecular chain composition and structural design, and (2) introduction of foreign implants. Although the method of regulating and modifying the polymer molecular chain improves the strength of the material, this method is limited in improving the toughness, which may be due to the fact that the sliding and decoupling of the molecular chains are replaced by strong covalent bonds, so that the dissipation of the rheological behavior is suppressed. For introduction of foreign implants, such as particle-reinforced polymers and fiber-reinforced materials, the mechanical properties of the composite material will theoretically be in a range limited by its composition. Therefore, the addition of implants also reduces the toughness of the composite material due to the low deformability of the implants.

As a thin film preparation method, magnetron sputtering coating can make the thin film material densely grow on the polymer material. A high bonding force is formed between the thin film and the polymer substrate, which can improve product quality, environmental protection, energy saving, prolong product life, and improve original performance. The layered structure design of introducing a metal layer on the polymer surface by magnetron sputtering coating technology is a possible strategy to affect the mechanical properties of the polymer, and has also been widely studied. However, the metal film composite polymer materials introduced in the literature still have the problem of unsatisfactory performance. For example, the thin film composite material obtained by compounding pure aluminum film and polyethylene terephthalate (PET) has a certain degree of toughening, but has a reduced strength, which limits the practical application of thin film composite materials.

SUMMARY

The main objective of the present disclosure is to provide a polymer composite material and a preparation method thereof, aiming at solving the problem that the existing metal film composite polymer materials are difficult to simultaneously take into account the strength and toughness of the material.

In order to achieve the above objective, the present disclosure provides a polymer composite material, including: a polymer base layer; and a metal thin film layer provided on a surface of the polymer base layer. The metal thin film layer is made of amorphous alloy.

In an embodiment, the amorphous alloy includes any one of MgZnCa alloy, AlNiY alloy, MgCuY alloy and ZrCuAl alloy.

In an embodiment, the amorphous alloy is the MgZnCa alloy, and an atomic ratio of Mg, Zn, and Ca in the MgZnCa alloy is 60:35:5.

In an embodiment, the amorphous alloy is the AlNiY alloy, and an atomic ratio of Al, Ni, and Y in the AlNiY alloy is 68:18:14.

In an embodiment, the polymer base layer is made of any one of polyethylene terephthalate (PET), polyimide (PI), polycarbonate (PC), polymethyl methacrylate (PMMA) and polypropylene (PP).

In an embodiment, a thickness of the polymer base layer is 50 μm to 1000 μm; and/or a thickness of the metal thin film layer is 50 nm to 5000 nm.

In order to achieve the above objective, the present disclosure further provides a method for preparing a polymer composite material as described above, and the method includes following operations: placing a metal target on a target position of a magnetron sputtering coater; putting a pretreated polymer substrate into the magnetron sputtering coater; vacuuming the magnetron sputtering coater to a vacuum state; adjusting a power of the magnetron sputtering coater; introducing Ar into the magnetron sputtering coater; and perform coating treatment on the polymer substrate, to form a metal thin film with an amorphous structure on a surface of the polymer substrate.

In an embodiment, an air pressure in the vacuum state is 10-3 torr to 10-9 torr, and a flow of Ar is 50 sccm to 70 sccm; during the coating treatment, a sputtering power is 300 W to 350 W, a temperature is 25° C. to 100° C., a target-base distance is 12 cm to 18 cm, and a sputtering rate of target atoms is 1 nm/min to 30 nm/min.

In an embodiment, the pretreated polymer substrate is obtained through the following operations:
placing the polymer substrate in ethanol and deionized water sequentially for ultrasonic cleaning to obtain the pretreated polymer substrate.

In an embodiment, before putting the metal target into the magnetron sputtering coater, the metal target is processed through the following operations:
sanding off a surface layer of the metal target with sandpaper, and then ultrasonically cleaning the metal target in acetone, ethanol and deionized water in sequence.

In technical solutions of the present disclosure, the polymer composite material includes a polymer base layer and a metal thin film layer provided on a surface of the polymer base layer. The metal thin film layer is made of amorphous alloy. That is, the surface of the polymer base layer is provided with a metal thin film with an amorphous structure. In this way, the arrangement of the metal thin film with amorphous structure can not only improve the mechanical properties, wear resistance and corrosion resistance of the polymer substrate material, but also can greatly improve the toughness of the polymer substrate material, to simultaneously improve the strength and toughness of the polymer material.

BRIEF DESCRIPTION OF THE DRAWINGS

In order to more clearly illustrate the technical solutions in the embodiments of the present disclosure or in the prior art, the following briefly introduces the accompanying drawings that need to be used in the description of the embodiments or the prior art. Obviously, the drawings in the following description are only some embodiments of the present disclosure. For those of ordinary skill in the art, other drawings can also be obtained based on the structures shown in these drawings without any creative effort.

Figure 1:
FIG. 1 is a photo of the original MZC/PET sample according to the present disclosure.

The realization of the objective, functional characteristics, and advantages of the present disclosure are further described with reference to the accompanying drawings.

DETAILED DESCRIPTION OF THE EMBODIMENTS

To make the purposes, technical solutions and advantages in the embodiments of the present disclosure clearer, the technical solutions in the embodiments of the present disclosure will be described clearly and completely below. If not indicated in the examples, the specific conditions are carried out according to the conventional conditions or the conditions suggested by the manufacturer. The reagents or instruments used without the manufacturer's indication are conventional products that can be purchased from the market. In addition, the meaning of "and/or" appearing in the disclosure includes three parallel scenarios. For example, "A and/or B" includes only A, or only B, or both A and B. Besides, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure. Based on the embodiments in the present disclosure, all other embodiments obtained by those of ordinary skill in the art without creative work fall within the protection scope of the present disclosure.

Due to the difficulty of simultaneously taking into account the strength and toughness of the existing metal film composite polymer materials, the practical use of the existing metal film composite polymer materials is limited by many problems. The applicant unexpectedly discovered and designed a high-strength and high-tough laminated composite material with the ability to self-assemble to generate biomimetic structures during actual tests and operations. Different from the traditional design, the composites discovered and designed in the present disclosure exhibit toughness limits beyond those predicted by continuum mechanics, which is because through the structural design of the composite material, a complex deformation field is constructed, so that the rheological process becomes opaque in the process of deformation, thereby creating an oriented state with higher fracture resistance, and strain-induced crystallization further increases the strength and toughness of the polymer. Meanwhile, the strengthening and toughening effects of the composite material are combined with the self-assembled pearl-like behavior, such that the composite material can be stretched to nearly 12 times their original length and exhibit high tensile strength and toughness through the toughening mechanism.

The present disclosure provides a polymer composite material. The polymer composite material includes a polymer base layer and a metal thin film layer provided on a surface of the polymer base layer. The metal thin film layer is made of amorphous alloy.

In technical solutions of the present disclosure, the polymer composite material includes the polymer base layer and the metal thin film layer provided on the surface of the polymer base layer. The metal thin film layer is made of amorphous alloy. That is, the surface of the polymer base layer is provided with a metal thin film with an amorphous structure. In this way, the arrangement of the metal thin film with amorphous structure enables the composite material to self-assemble to generate the biomimetic structure and to create non-affine stress fields inside the polymer, which can not only improve the mechanical properties, wear resistance and corrosion resistance of the polymer substrate material, but also can greatly improve the toughness of the polymer substrate material, to simultaneously improve the strength and toughness of the polymer material.

The polymer composite material of the present disclosure has both high strength and high toughness. This enhancement can be attributed to a novel toughening mechanism. The deformation process of the polymer composite material of the present disclosure after uniaxial stretching is similar to that of perlite. The amorphous metal thin film layer is broken into regular fragments that resemble rigid regions of perlite-like materials. Relative rotation and sliding of the fragments during deformation dissipate additional energy, which prevents the evolution of shear bands. In addition, the rigid region formed by the fragments forces the molecular chains of the closed region to flow to the non-closed region in the plane, forming a non-contamination flow. Both of which cause the orientation of the molecular chain and the crystallization of a specific crystal phase, resulting in strengthening and toughening. In brief, this is a new toughening mechanism for polymer materials, that is, the stress and strain fields are uniform without concentration, and the stronger and tougher the material is. Such super-tough composite material based on new mechanism may play an increasingly central role in emerging applications such as improving the biomechanical compatibility of electronic devices and find promising applications in armor engineering and aerospace engineering.

Theoretically speaking, the toughening mechanism in the present disclosure can be applied to all composite materials containing polymer components. According to the current research, the conditions for the wide application of this toughening mechanism can be summarized as: (1) The polymer has the ability to achieve orientation under sufficient thermodynamic conditions; (2) The selected metal material is preferably brittle, and the strength of the metal material is large enough, which determines the magnitude of the strain gradient; (3) The combination of metal and polymer has sufficient strength to limit the strain at the polymer interface. In addition, the choice of the thickness of the polymer substrate material and the geometric parameters of the fractured fragments are also critical to the toughening effect of the composite material.

In the specific examples of the present disclosure, some embodiments are given for the above condition (1). In some embodiments of the present disclosure, the polymer base layer is made of polyethylene terephthalate (PET), that is, the polymer base layer is a PET film. In other embodiments of the present disclosure, the polymer base layer is made of polyimide (PI), that is, the polymer base layer is a PI film. In other embodiments of the present disclosure, the polymer base layer may also be a polycarbonate (PC) film, a polymethyl methacrylate (PMMA) film, or a polypropylene (PP) film, or the like.

Further, in the specific examples of the present disclosure, some embodiments are given for the above condition (2). In some embodiments of the present disclosure, the amorphous alloy is MgZnCa alloy, and the atomic ratio of Mg, Zn, and Ca in the MgZnCa alloy is 60:35:5. In other embodiments of the present disclosure, the amorphous alloy is AlNiY alloy, and the atomic ratio of Al, Ni, and Y in the AlNiY alloy is 68:18:14. In other embodiments of the present disclosure, the amorphous alloy may also be MgCuY alloy or ZrCuAl alloy, or other quaternary or more quaternary alloy materials with an amorphous structure.

Besides, in the specific examples of the present disclosure, some embodiments are also given for the thickness of the above-mentioned polymer. Specifically, a thickness of the polymer base layer is 50 μm to 1000 μm. Further, a thickness of the metal thin film layer is 50 nm to 5000 nm. In this way, the resulting polymer composite can better achieve high strength and high toughness.

Hereinafter, taking the polymer substrate as PET and the amorphous alloy as MgZnCa alloy (MZC for short, the atomic ratio of Mg, Zn, and Ca is 60:35:5) as an example. The various properties of the polymer composite material (referred to as MZC/PET) provided by the present disclosure are briefly described with reference to the accompanying drawings.

Figure 2:
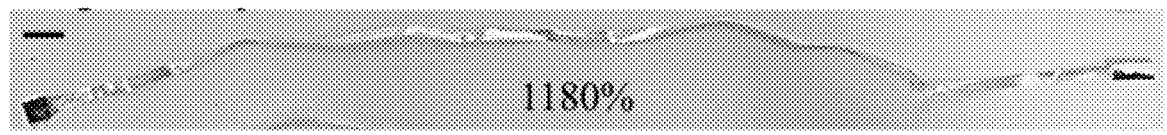
FIG. 2 is a photo of the stretched MZC/PET sample according to the present disclosure.
Figure 3:
FIG. 3 is a schematic diagram of the stretching process of the MZC/PET sample from FIG. 1 to FIG. 2 according to the present disclosure.

FIG. 1 shows a photo of the original MZC/PET sample, FIG. 2 shows a photo of the stretched MZC/PET sample, and FIG. 3 is a schematic diagram of the stretching process, and the scale bar is 10 mm. It can be seen from FIG. 1 to FIG. 3 that the fracture elongation of the MZC/PET in the present disclosure reaches 1180%.

Figure 4:
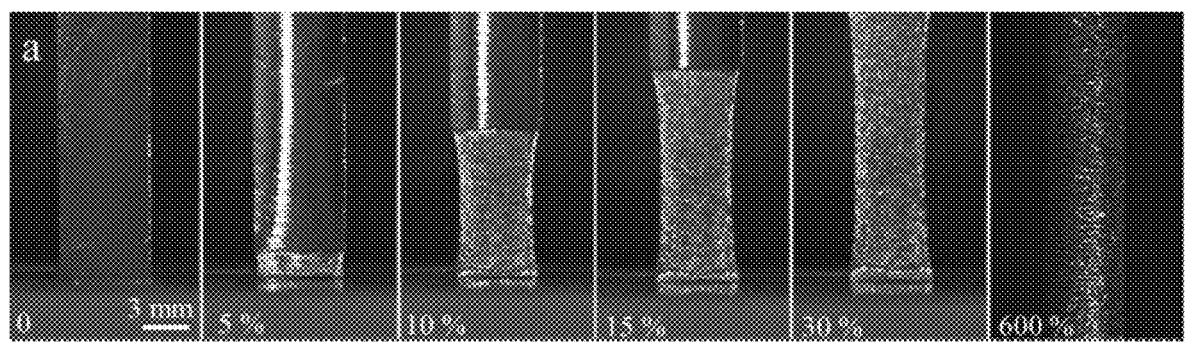
FIG. 4 is a photo of the stretching process of MZC/PET at different elongations according to the present disclosure.
Figure 5:
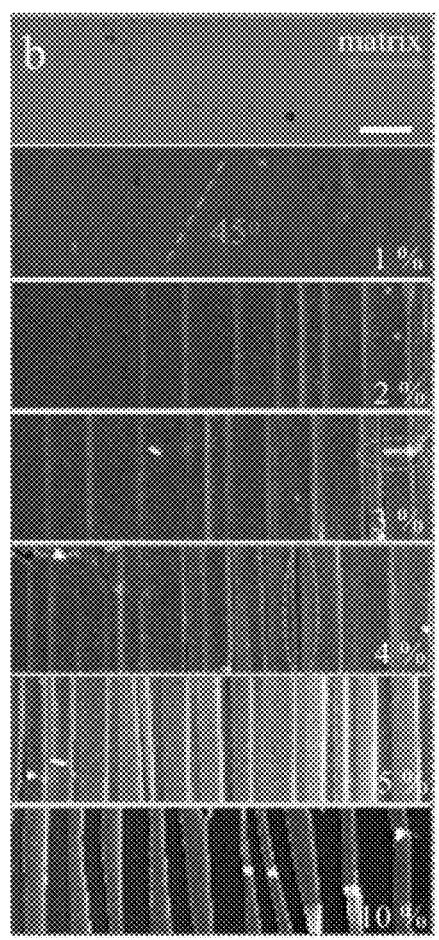
FIG. 5 to FIG. 8 are SEM images of MZC/PET at different elongations according to the present disclosure.
Figure 6:
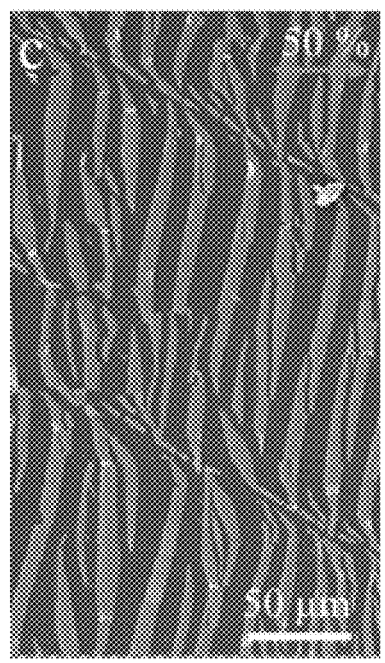
Figure 7:
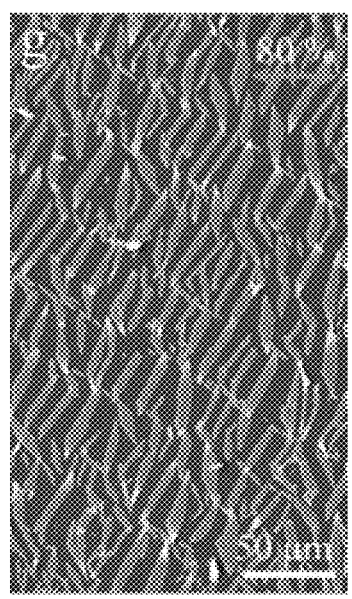
Figure 8:
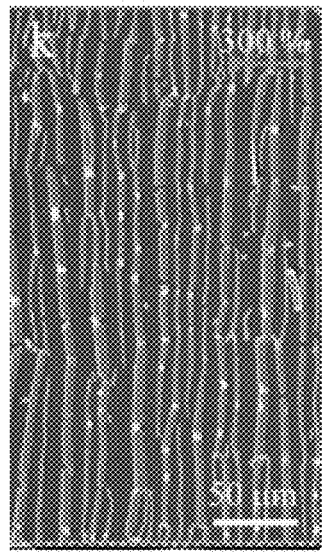
Figure 9:
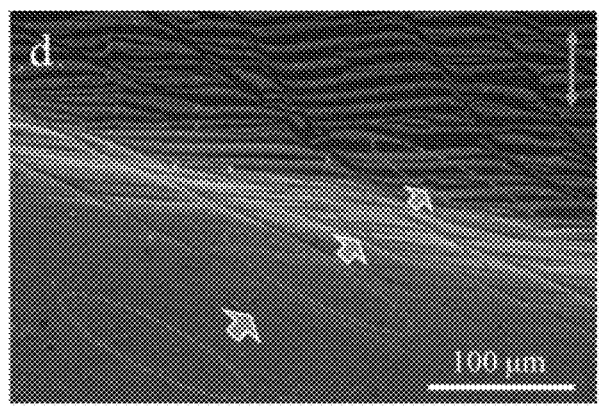
FIG. 9 is an SEM image of the fracture evolution of MZC/PET according to the present disclosure.
Figure 10:
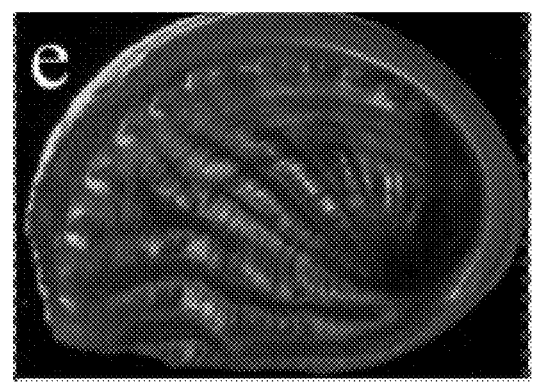
FIG. 10 is the appearance image of natural pearl.
Figure 11:
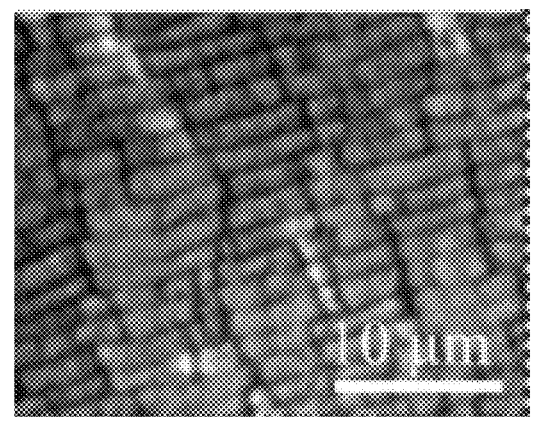
FIG. 11 is a microstructure of natural pearl.

FIG. 4 is a photo of the stretching process of MZC/PET at different elongations, FIG. 5 to FIG. 8 are SEM images of MZC/PET at different elongations, FIG. 9 is an SEM image of the fracture evolution of MZC/PET (processed from FIG. 5 to FIG. 8), FIG. 10 is the appearance image of natural pearl, and FIG. 11 is a microstructure of natural pearl. In FIG. 5 to FIG. 9, a direction of the arrow in the upper right corner corresponds to the stretching direction. As can be seen from FIG. 4 to FIG. 11, the deformation process of MZC/PET in the present disclosure after stretching is similar to that of perlite. The amorphous metal thin film layer is broken into regular fragments similar to rigid regions of perlite-like materials, and the toughening mechanism in the present disclosure described above has been verified.

Figure 12:
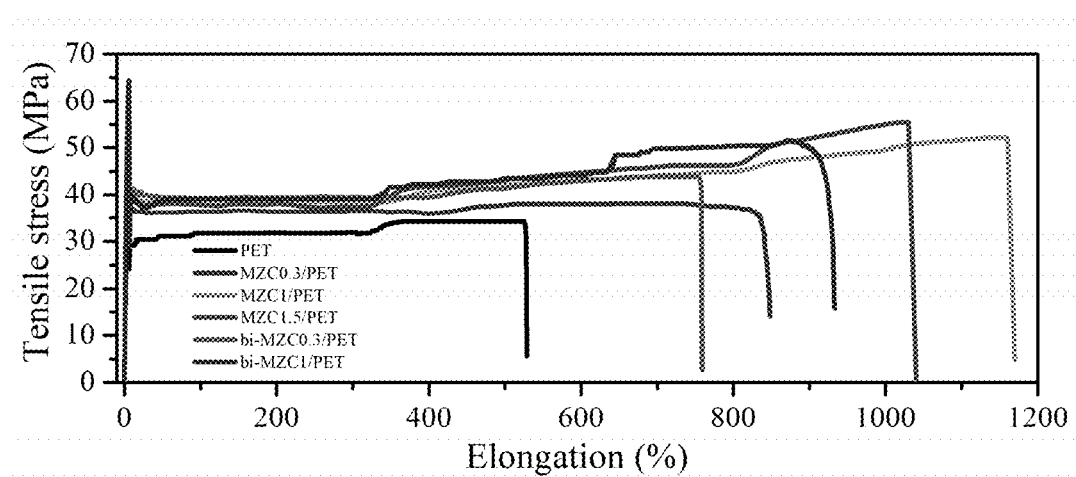
FIG. 12 is a stress-strain curve of MZC/PET according to the present disclosure.

FIG. 12 is a stress-strain curve of MZC/PET. It can be seen from FIG. 12 that the fracture stress of MZC/PET is up to 52 MPa, and the fracture elongation is 1180%. However, the fracture stress of the PET film without the metal thin film layer is 51.2 MPa, and the fracture elongation is 525%, indicating that the MZC/PET in the present disclosure not only achieves substantial toughening, but also ensures the strength of the material.

Based on the above polymer composite material of the present disclosure, the present disclosure further provides a method for preparing a polymer composite material. A metal thin film layer is plated on the polymer substrate by means of magnetron sputtering, so as to prepare the polymer composite material.

Figure 13:
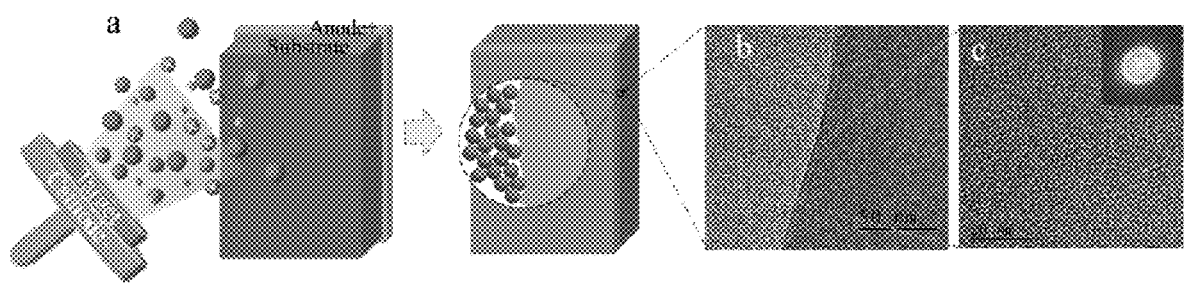
FIG. 13 shows a schematic diagram of a method for preparing a polymer composite material using a magnetron sputtering method (a), an interface image of MZC/PET (b) and a TEM image of the MZC microstructure in MZC/PET (c) according to the present disclosure.

In an embodiment of the present disclosure, combined with the schematic diagram of the magnetron sputtering method shown in FIG. 13 ((a) of FIG. 13), the method for preparing the polymer composite material includes the following operations:

placing a metal target on a target position of a magnetron sputtering coater; putting a pretreated polymer substrate into the magnetron sputtering coater; vacuuming the magnetron sputtering coater to a vacuum state; adjusting a power of the magnetron sputtering coater; introducing Ar into the magnetron sputtering coater; and perform coating treatment on the polymer substrate, to form a metal thin film with an amorphous structure on a surface of the polymer substrate.

The present disclosure provides the method for preparing the polymer composite material. The metal thin film layer with the amorphous structure is formed on the surface of the polymer substrate by means of magnetron sputtering. The metal thin film layer has the following advantages. (1) The thickness of the metal thin film layer can be adjusted. (b) of FIG. 13 and (c) of FIG. 13 are the interface of MZC/PET ((b) of FIG. 13) and the TEM image ((c) of FIG. 13) of the MZC microstructure of the present disclosure. It can be seen that the surface of the metal thin film layer is uniform. (2) The metal thin film layer has a high bonding force with the polymer base layer, and the composite material has high hardness, strong wear resistance and certain corrosion resistance.

In the specific embodiments of the present disclosure, controlling various process parameters of magnetron sputtering is beneficial to form the metal thin film layer with the amorphous structure on the surface of the polymer substrate. The air pressure in the vacuum state is $10^{-3}$ torr to $10^{-9}$ torr, and a flow of Ar is 50 sccm to 70 sccm. In addition, during the coating treatment, a sputtering power is 300 W to 350 W, a temperature is 25° C. to 100° C., the target-base distance is 12 cm to 18 cm, and a sputtering rate of target atoms is 1 nm/min to 30 nm/min. By controlling the sputtering power and Ar flow, a reflective layer with a suitable optical constant can be formed on the surface of the polymer substrate. According to the target material, the bombardment efficiency of plasma and electrons on the target can be controlled by controlling the sputtering power, the target-base distance, and the sputtering rate of target atoms, such that the polymer substrate is firmly combined with the metal thin film layer, and the microstructure of the metal thin film is controlled to obtain a corresponding color.

Further, the method for preparing the polymer composite material in the present disclosure further includes the operation of pre-processing the target, including grinding, cleaning, etc., before the coating treatment, so as to obtain a clean and flat surface. The operation of pretreating the target include: sanding off a surface layer of the metal target with sandpaper, and then ultrasonically cleaning the metal target in acetone, ethanol and deionized water in sequence, and then placing the target into the magnetron sputtering coater.

Figure 14:
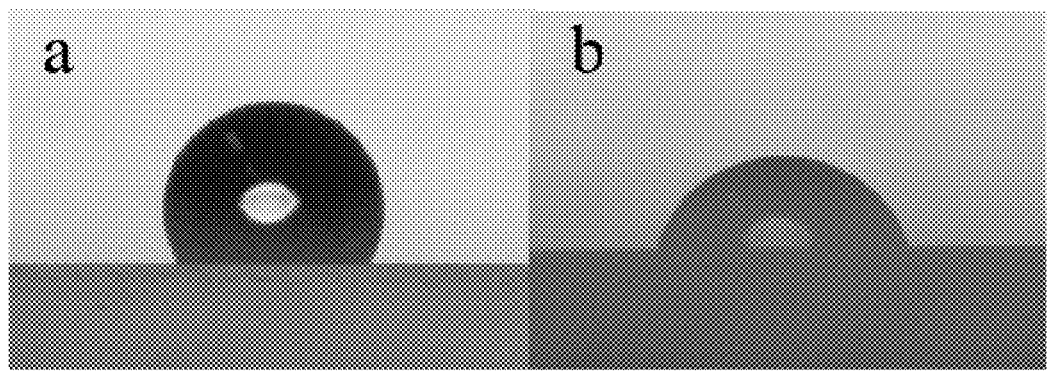
FIG. 14 shows the test results of the contact angle of water droplets on the interface before and after plasma pretreatment on the surface of the substrate according to the present disclosure.

Further, after the target is placing into the magnetron sputtering coater and before the coating treatment is performed on the target, the method includes the operation of plasma pretreatment on the target. The impurity atoms on the surface of the target are removed by plasma pretreatment, and the bonding force with the polymer substrate is improved. After the target is put into the magnetron sputtering coater, the magnetron sputter coater is evacuated to $10^{-3}$ torr to $10^{-9}$ torr, and Ar is introduced for plasma pretreatment. FIG. 14 shows the test results of the contact angle of water droplets on the interface before and after plasma pretreatment on the surface of the substrate. (a) of FIG. 14 is before plasma pretreatment, and (b) of FIG. 14 is after plasma pretreatment. As can be seen from (a) of FIG. 14 and (b) of FIG. 14, after plasma activation, the contact angle of the PET surface is significantly reduced, indicating that its surface energy is increased, and the adsorption tendency is also increased at the interface between the PET and MZC films. Therefore, it has good adhesion to MZC film, which can be seen from the high-resolution TEM images (i.e., (b) of FIG. 13 and (c) of FIG. 13), indicating that in the polymer composite material provided by the present disclosure, the polymer base layer and the metal thin film layer have good bonding strength.

In addition, the method for preparing the polymer composite material in the present disclosure further includes the operation of cleaning the polymer substrate before the coating treatment, to obtain a clean surface, which is beneficial to the compounding of the polymer substrate and the metal thin film. The operation of pretreating the polymer substrate includes: placing the polymer substrate in ethanol and deionized water sequentially for ultrasonic cleaning, and performing ultrasonic cleaning on the polymer substrate in ethanol for 20-30 min and in deionized water for 20-30 min to remove surface impurities on the polymer substrate, to obtain the pretreated polymer substrate with a clean surface, and placing the pretreated polymer substrate in the magnetron sputter coater.

The technical solutions of the present disclosure will be further described in detail below with reference to specific embodiments and accompanying drawings. It should be understood that the following embodiments are only used to explain the present disclosure, but are not intended to limit the present disclosure.

First Embodiment

Figure 15:
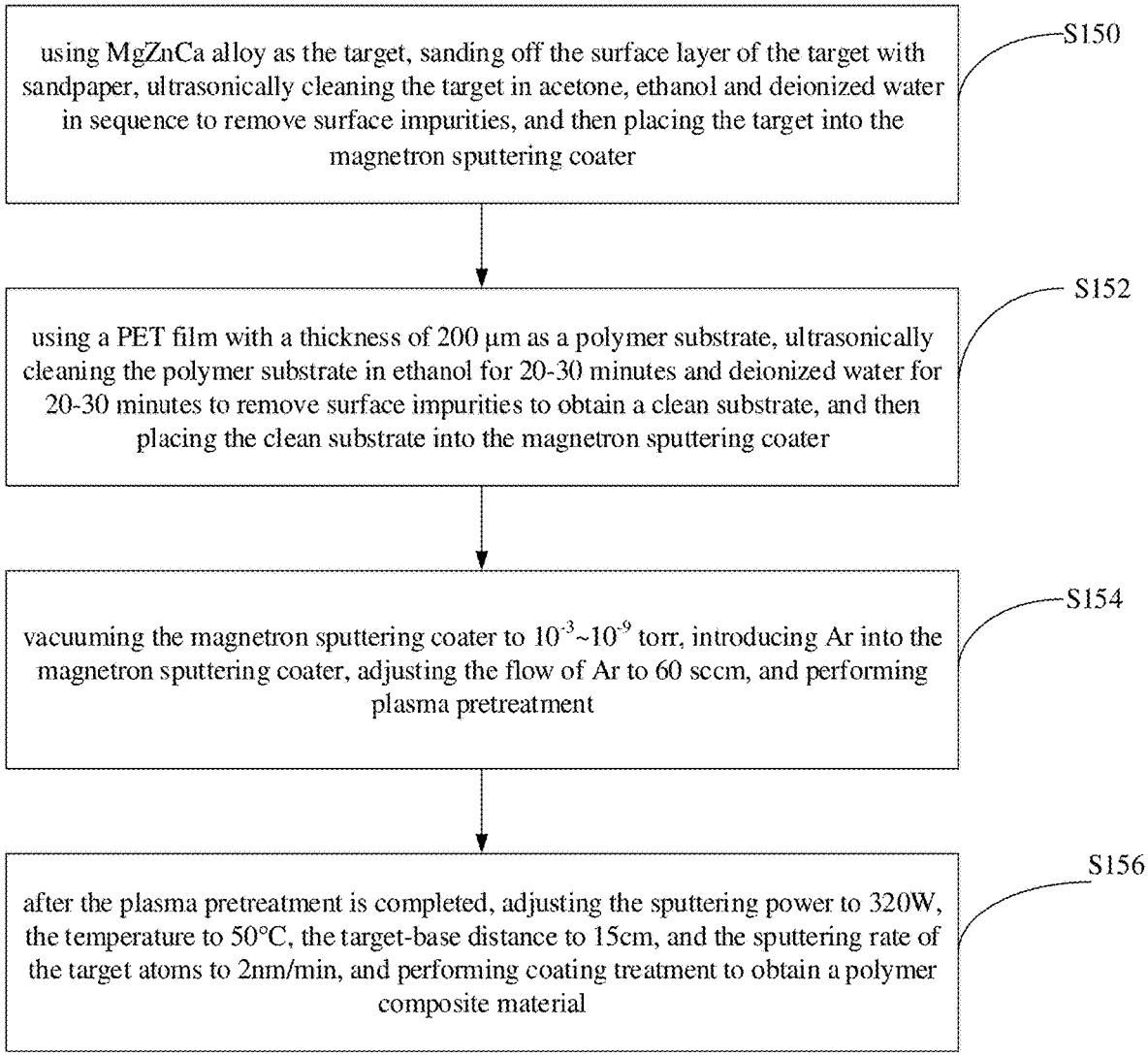
FIG. 15 is a schematic flowchart of a method for preparing a polymer composite material according to a first embodiment of the present disclosure.

As shown in FIG. 15, FIG. 15 is a schematic flowchart of a method for preparing a polymer composite material according to a first embodiment of the present disclosure. The method for preparing the polymer composite material includes the following operations:

Operation S150, using MgZnCa alloy (the atomic ratio of Mg, Zn, and Ca is 60:35:5 as the target, sanding off the surface layer of the target with sandpaper, ultrasonically cleaning the target in acetone, ethanol and deionized water in sequence to remove surface impurities, and then placing the target into the magnetron sputtering coater;

Operation S152, using a PET film with a thickness of 200 μm as a polymer substrate, ultrasonically cleaning the polymer substrate in ethanol for 20-30 minutes and deionized water for 20-30 minutes to remove surface impurities to obtain a clean substrate, and then placing the clean substrate into the magnetron sputtering coater;

Operation S154, vacuuming the magnetron sputtering coater to $10^{-3}$~$10^{-9}$ torr, introducing Ar into the magnetron sputtering coater, adjusting the flow of Ar to 60 sccm, and performing plasma pretreatment;

Operation S156, after the plasma pretreatment is completed, adjusting the sputtering power to 320 W, the temperature to 50° C., the target-base distance to 15 cm, and the sputtering rate of the target atoms to 2 nm/min, and performing coating treatment to obtain a polymer composite material.

The thickness of the metal thin film layer of the polymer composite material obtained by Surface Profiler detection is 50 nm to 5000 nm, and the color is silvery white.

Second Embodiment

Figure 16:
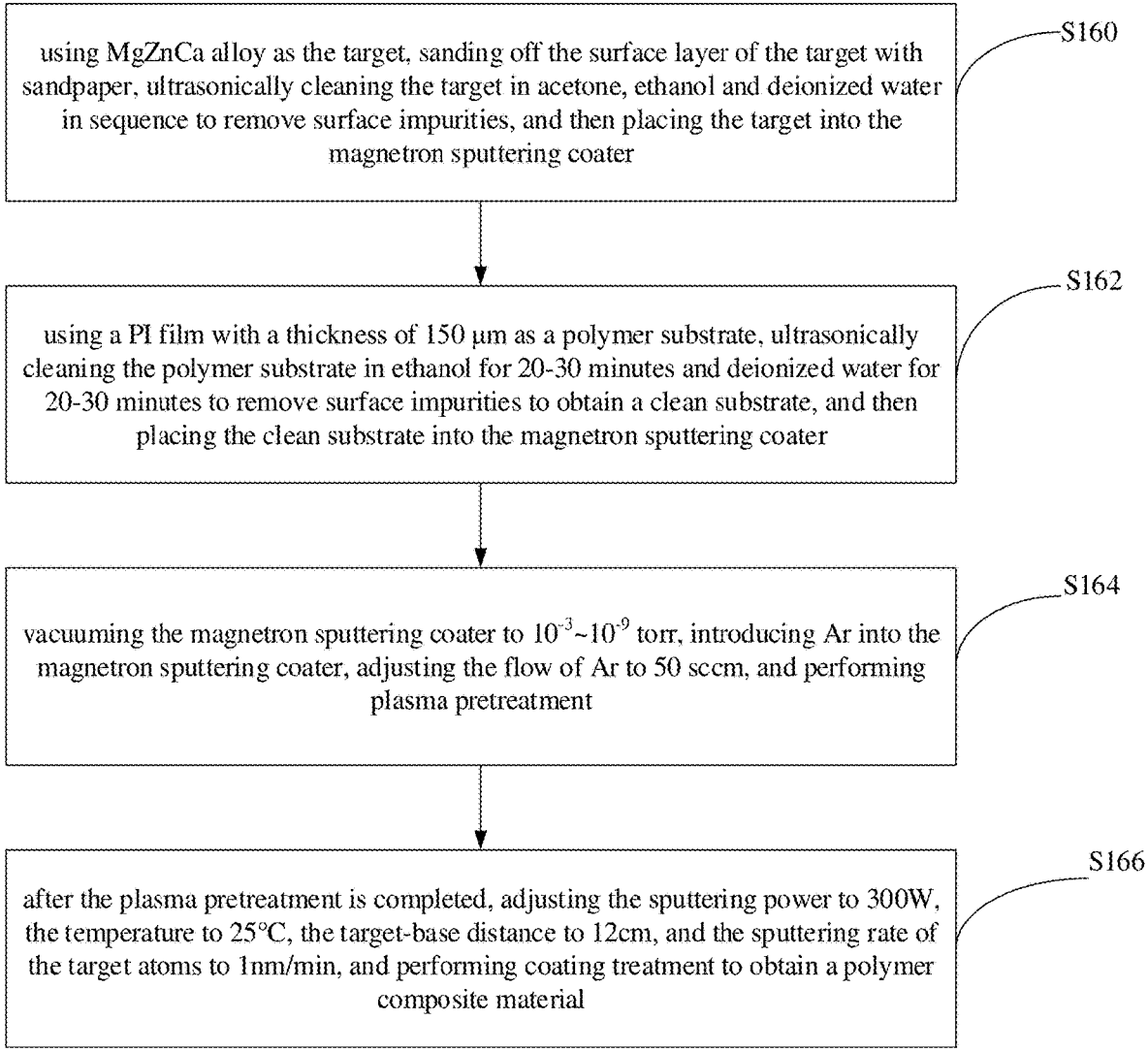
FIG. 16 is a schematic flowchart of a method for preparing a polymer composite material according to a second embodiment of the present disclosure.

As shown in FIG. 16, FIG. 16 is a schematic flowchart of a method for preparing a polymer composite material according to a second embodiment of the present disclosure. The method includes the following operations:

Operation S160, using MgZnCa alloy (the atomic ratio of Mg, Zn, and Ca is 60:35:5 as the target, sanding off the surface layer of the target with sandpaper, ultrasonically cleaning the target in acetone, ethanol and deionized water in sequence to remove surface impurities, and then placing the target into the magnetron sputtering coater;

Operation S162, using a PI film with a thickness of 150 μm as a polymer substrate, ultrasonically cleaning the polymer substrate in ethanol for 20-30 minutes and deionized water for 20-30 minutes to remove surface impurities to obtain a clean substrate, and then placing the clean substrate into the magnetron sputtering coater;

Operation S164, vacuuming the magnetron sputtering coater to $10^{-3}$~$10^{-9}$ torr, introducing Ar into the magnetron sputtering coater, adjusting the flow of Ar to 50 sccm, and performing plasma pretreatment;

Operation S166, after the plasma pretreatment is completed, adjusting the sputtering power to 300 W, the temperature to 25° C., the target-base distance to 12 cm, and the sputtering rate of the target atoms to 1 nm/min, and performing coating treatment to obtain a polymer composite material.

The thickness of the metal thin film layer of the polymer composite material obtained by Surface Profiler detection is 100 nm to 5000 nm, and the color is silvery white.

Third Embodiment

Figure 17:
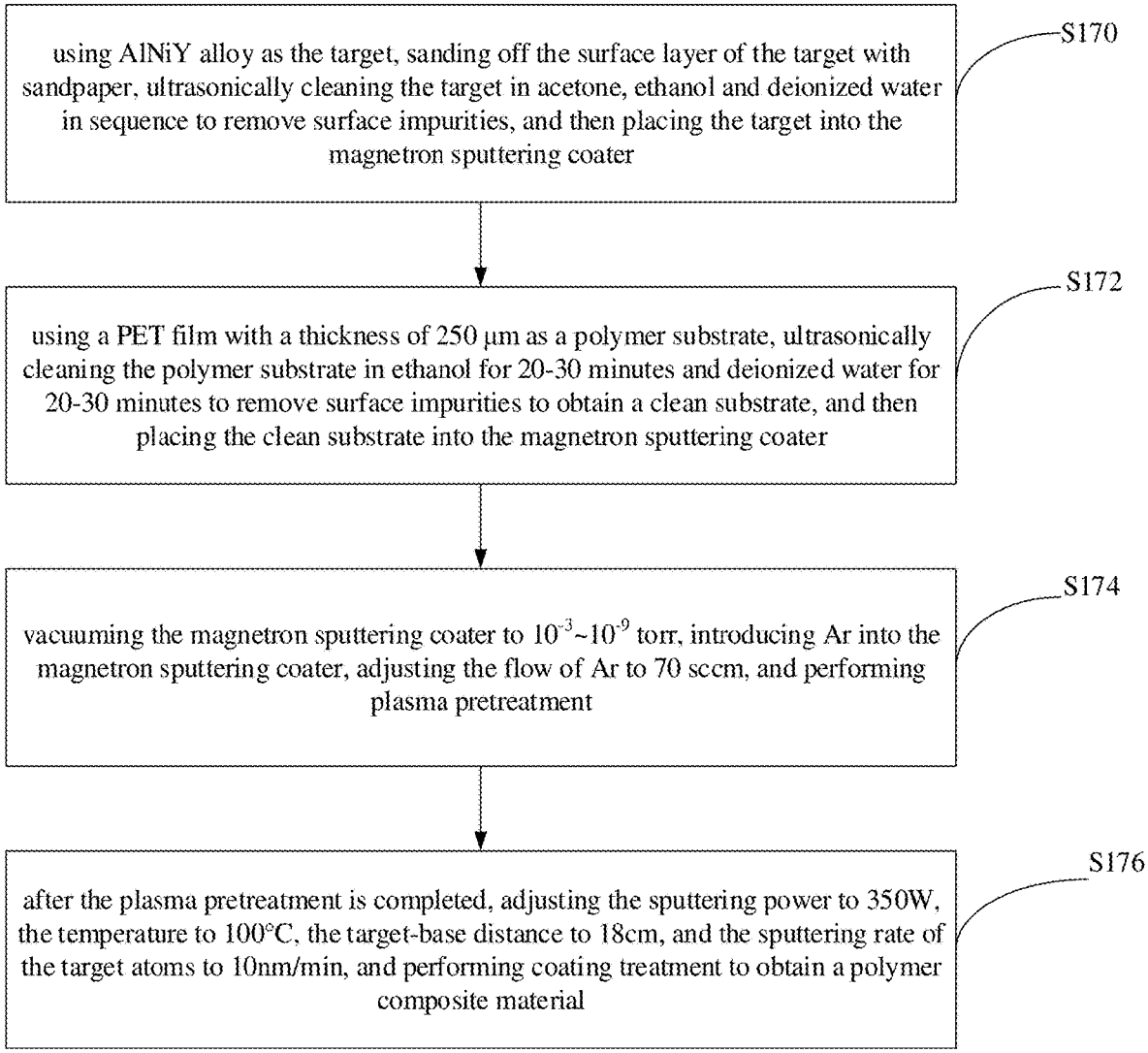
FIG. 17 is a schematic flowchart of a method for preparing a polymer composite material according to a third embodiment of the present disclosure.

As shown in FIG. 17, FIG. 17 is a schematic flowchart of a method for preparing a polymer composite material according to a third embodiment of the present disclosure. The method includes the following operations:

Operation S170, using AlNiY alloy (the atomic ratio of Al, Ni, and Y is 68:18:14) as the target, sanding off the surface layer of the target with sandpaper, ultrasonically cleaning the target in acetone, ethanol and deionized water in sequence to remove surface impurities, and then placing the target into the magnetron sputtering coater;

Operation S172, using a PET film with a thickness of 250 μm as a polymer substrate, ultrasonically cleaning the polymer substrate in ethanol for 20-30 minutes and deionized water for 20-30 minutes to remove surface impurities to obtain a clean substrate, and then placing the clean substrate into the magnetron sputtering coater;

Operation S174, vacuuming the magnetron sputtering coater to $10^{-3}$~$10^{-9}$ torr, introducing Ar into the magnetron sputtering coater, adjusting the flow of Ar to 70 sccm, and performing plasma pretreatment;

Operation S176, after the plasma pretreatment is completed, adjusting the sputtering power to 350 W, the temperature to 100° C., the target-base distance to 18 cm, and the sputtering rate of the target atoms to 10 nm/min, and performing coating treatment to obtain a polymer composite material.

The thickness of the metal thin film layer of the polymer composite material obtained by Surface Profiler detection is 50 nm to 5000 nm, and the color is silvery white.

Fourth Embodiment

Figure 18:
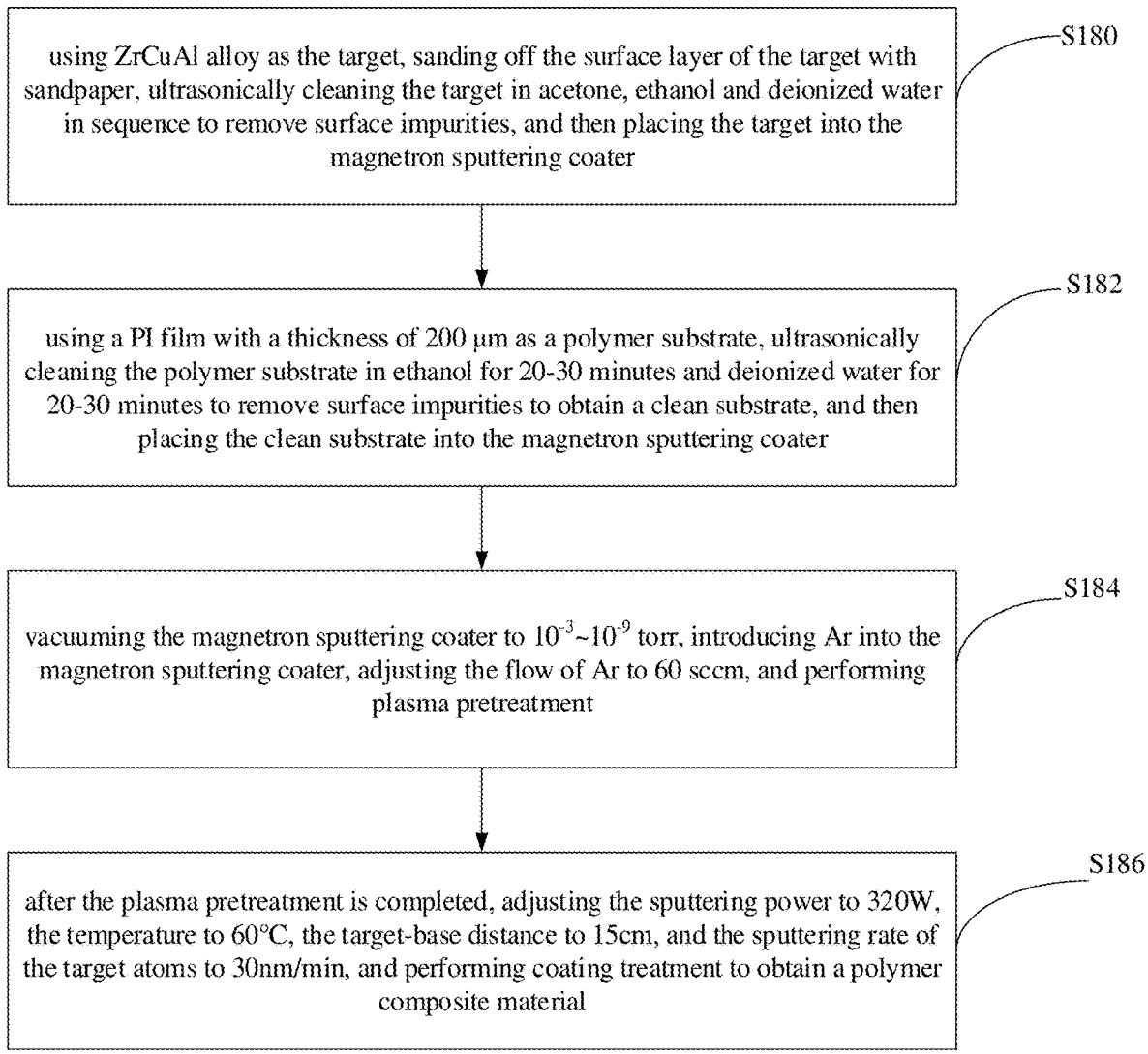
FIG. 18 is a schematic flowchart of a method for preparing a polymer composite material according to a fourth embodiment of the present disclosure.

As shown in FIG. 18, FIG. 18 is a schematic flowchart of a method for preparing a polymer composite material according to a third embodiment of the present disclosure. The method includes the following operations:

Operation S180, using ZrCuAl alloy as the target, sanding off the surface layer of the target with sandpaper, ultrasonically cleaning the target in acetone, ethanol and deionized water in sequence to remove surface impurities, and then placing the target into the magnetron sputtering coater;

Operation S182, using a PI film with a thickness of 200 μm as a polymer substrate, ultrasonically cleaning the polymer substrate in ethanol for 20-30 minutes and deionized water for 20-30 minutes to remove surface impurities to obtain a clean substrate, and then placing the clean substrate into the magnetron sputtering coater;

Operation S184, vacuuming the magnetron sputtering coater to $10^{-3}$~$10^{-9}$ torr, introducing Ar into the magnetron sputtering coater, adjusting the flow of Ar to 60 sccm, and performing plasma pretreatment;

Operation S186, after the plasma pretreatment is completed, adjusting the sputtering power to 320 W, the temperature to 60° C., the target-base distance to 15 cm, and the sputtering rate of the target atoms to 30 nm/min, and performing coating treatment to obtain a polymer composite material.

The thickness of the metal thin film layer of the polymer composite material obtained by Surface Profiler detection is 50 nm to 5000 nm, and the color is silvery white.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A polymer composite material, comprising:
   a polymer base layer; and
   a metal thin film layer provided on a surface of the polymer base layer,
   wherein the metal thin film layer is made of amorphous alloy,
   the amorphous alloy comprises any one of MgZnCa alloy, AlNiY alloy, MgCuY alloy and ZrCuAl alloy, an atomic ratio of Mg, Zn, and Ca in the MgZnCa alloy is 60:35:5,
   after uniaxial stretching of the polymer composite material, the amorphous metal thin film layer is broken into regular fragments in rigid regions, relative rotation and sliding of the fragments during deformation dissipate additional energy, the rigid region formed by the fragments forces the molecular chains of the closed region to flow to the non-closed region in the plane.

2. The polymer composite material of claim 1, wherein the polymer base layer is made of any one of polyethylene terephthalate (PET), polyimide (PI), polycarbonate (PC), polymethyl methacrylate (PMMA) and polypropylene (PP).

3. The polymer composite material of claim 1, wherein a thickness of the polymer base layer is 50 μm to 1000 μm; and/or a thickness of the metal thin film layer is 50 nm to 5000 nm.

4. A method for preparing a polymer composite material, wherein the polymer composite material comprises a polymer base layer and a metal thin film layer provided on a surface of the polymer base layer, the metal thin film layer is made of amorphous alloy, the amorphous alloy comprises any one of MgZnCa alloy, AlNiY alloy, MgCuY alloy and ZrCuAl alloy, an atomic ratio of Mg, Zn, and Ca in the MgZnCa alloy is 60:35:5, after uniaxial stretching of the polymer composite material, the amorphous metal thin film layer is broken into regular fragments in rigid regions, relative rotation and sliding of the fragments during deformation dissipate additional energy, the rigid region formed by the fragments forces the molecular chains of the closed region to flow to the non-closed region in the plane, and the method comprises following operations:
   placing a metal target on a target position of a magnetron sputtering coater;
   putting a pretreated polymer substrate into the magnetron sputtering coater;
   vacuuming the magnetron sputtering coater to a vacuum state;
   adjusting a power of the magnetron sputtering coater;
   introducing Ar into the magnetron sputtering coater; and
   perform coating treatment on the polymer substrate, to form a metal thin film with an amorphous structure on a surface of the polymer substrate.

5. The method of claim 4, wherein an air pressure in the vacuum state is $10^{-3}$ torr to $10^{-9}$ torr, and a flow of Ar is 50 sccm to 70 sccm;

during the coating treatment, a sputtering power is 300 W to 350 W, a temperature is 25° C. to 100° C., a target-base distance is 12 cm to 18 cm, and a sputtering rate of target atoms is 1 nm/min to 30 nm/min.

6. The method of claim 4, wherein the pretreated polymer substrate is obtained through the following operations:

placing the polymer substrate in ethanol and deionized water sequentially for ultrasonic cleaning to obtain the pretreated polymer substrate.

7. The method of claim 4, wherein before putting the metal target into the magnetron sputtering coater, the metal target is processed through the following operations:

sanding off a surface layer of the metal target with sandpaper, and then ultrasonically cleaning the metal target in acetone, ethanol and deionized water in sequence.

* * * * *